United States Patent [19]

Nilsson et al.

[11] 4,005,319
[45] Jan. 25, 1977

[54] PIEZOELECTRIC GENERATOR OPERATED BY FLUID FLOW

[75] Inventors: Jan Nilsson, Ronninge; Rune Swänson, Ljungsbro, both of Sweden

[73] Assignee: Saab-Scania Aktiebolag, Linkoping, Sweden

[22] Filed: Oct. 1, 1975

[21] Appl. No.: 618,422

Related U.S. Application Data

[63] Continuation-in-part of Ser. No. 353,323, April 23, 1973, abandoned.

[52] U.S. Cl. .............................. 310/8.3; 310/8.5; 310/9.1; 102/70.2 G
[51] Int. Cl.² ........................................ H01L 41/04
[58] Field of Search .............. 310/8.2, 8.3, 8.5, 8.6, 310/8.8, 9.1, 9.4; 102/81, 70.2 G; 73/194 B, 194 C; 84/DIG. 24

[56] References Cited

UNITED STATES PATENTS

| | | | |
|---|---|---|---|
| 2,809,520 | 10/1957 | Richard, Jr. | 73/194 B |
| 2,895,063 | 7/1959 | Morris | 310/15 |
| 3,386,287 | 6/1968 | Hurvitz | 73/194 C |
| 3,473,377 | 10/1969 | Reinecke | 73/194 C |
| 3,696,673 | 10/1972 | Ribner et al. | 73/194 B |

*Primary Examiner*—Mark O. Budd
*Attorney, Agent, or Firm*—Ira Milton Jones & Associates

[57] ABSTRACT

An electrical generator for projectiles and the like comprises a piezoelectric element housed in a cavity through which air is forced by missile movement. A reed-like tongue in the cavity has one end captive, its other end near a ram air inlet that terminates in a nozzle outlet which is aligned with the tongue and is so configured as to enable the ram air to impart vigorous vibration to the tongue. The piezoelectric element has a vibration transmitting connection with the tongue, near the captive end of the latter.

5 Claims, 5 Drawing Figures

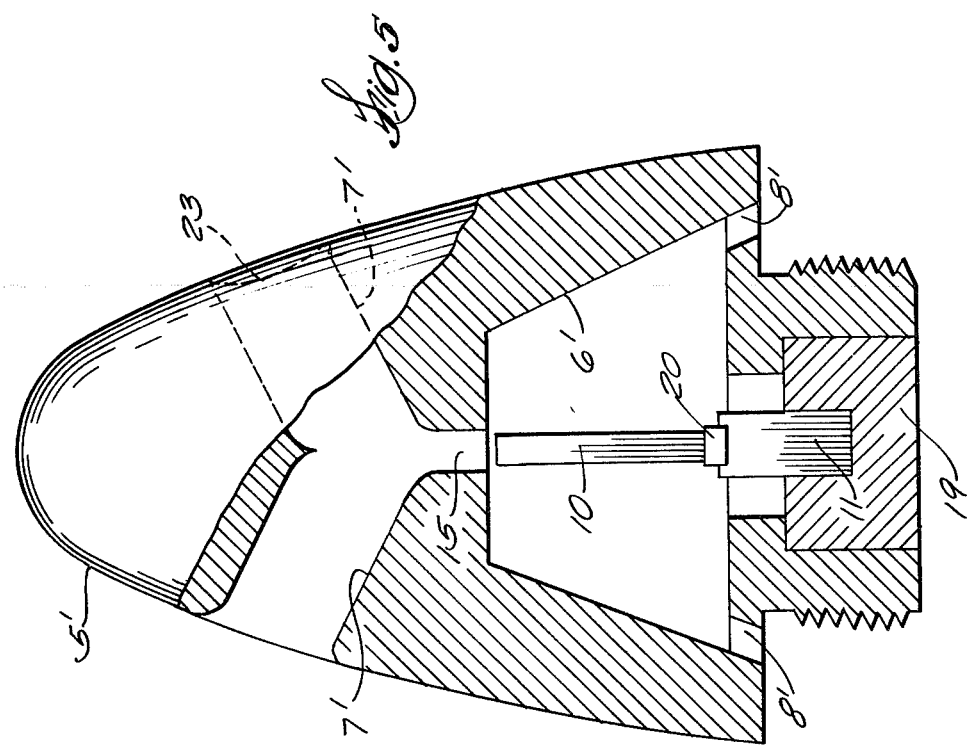
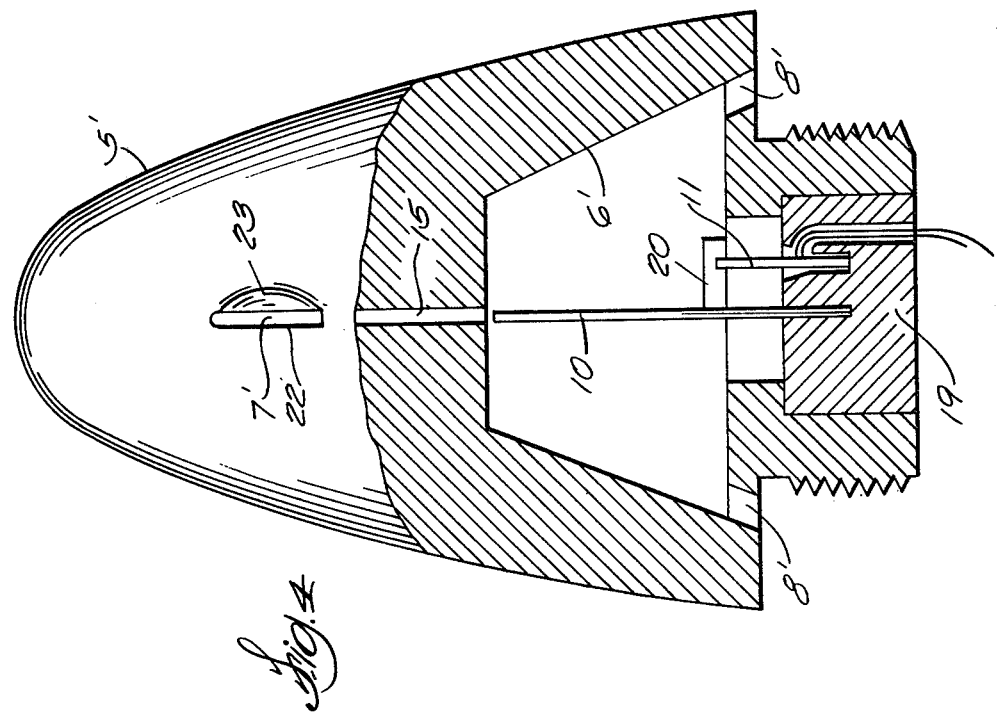

PIEZOELECTRIC GENERATOR OPERATED BY FLUID FLOW

This application is a continuation-in-part of the applicants' copending application, Ser. No. 353,323, filed Apr. 23, 1973.

This invention relates to electrical generators of the type used for energizing the electrical and electronic system of projectiles and similar vehicles, and refers more particularly to an improved electrical generator comprising a piezoelectric element and means for imparting vibration to the piezoelectric element in consequence of relative motion between a body in which the piezoelectric element is housed and an ambient fluid.

U.S. Pat. No. 3,666,976, to R. D. Gourlay, discloses an electric generator that is of the general type to which the present invention relates, in that it comprises a piezoelectric element housed in a cavity in a body, and means for bringing relatively moving fluid into the cavity from outside the body and for producing in such fluid a vibration that is imparted to the piezoelectric element. As disclosed in that patent, fluid is brought into the body through a nozzle which is so arranged in juxtaposition to a sharp annular edge as to produce vibrations in the incoming fluid. The edge is formed on the wall of an acoustically resonant cavity in which the piezoelectric element is housed, and this cavity serves to match the characteristically low impendance of the fluid (typically, air) with the substantially higher impedance of the piezoelectric element.

In order to achieve a reasonable degree of efficiency in the transfer of vibrations from the fluid to the piezoelectric element, the acoustical elements of the apparatus of the Gourlay patent must be tuned to a resonant frequency which closely matches the characteristic frequency of the piezoelectric element. However, such a generator is frequently used in projectiles and missiles which move in an air environment, and the required frequency matching then poses difficulties owing to the fact that the resonant frequency of an acoustical system varies directly with the velocity of sound in the medium in which the system operates and the velocity of sound in air varies markedly with changes in air temperature.

By contrast, it is an object of the present invention to provide an electrical generator which is suitable for projectiles and similar bodies that have motion relative to an environmental fluid, which generator comprises a piezoelectric element and means for imparting vibration to the piezoelectric element in consequence of circulation of the fluid through a chamber in the body in which the piezoelectric element is housed, said means for imparting vibration to the piezoelectric element comprising a simple mechanical element that transfers energy from the fluid to the piezoelectric element with a high efficiency that is substantially independent of environmental conditions.

Thus it is another and more specific object of this invention to provide an electric generator of the type comprising a piezoelectric element that vibrates in response to the vibrations of a fluid medium forced into a chamber or cavity in a body in which the piezoelectric element is housed, wherein impedance matching between the medium and the piezoelectric element is efficiently achieved by means of a simple mechanical element with which the piezoelectric element has a motion transmitting connection, said mechanical element being arranged to be vibrated by the incoming fluid and being substantially unaffected by changes in conditions of the fluid.

Another specific object of this invention is to provide compact, dependable and efficient electrical power supply apparatus for a moving vehicle, which apparatus comprises a reed-like tongue so connected with a piezoelectric element that flexure of the tongue imposes mechanical stresses upon the piezoelectric element, and means for conducting ram air into and through a cavity in the vehicle in which the tongue is located and for so transferring energy from such air to the tongue that the tongue is caused to have vigorous vibration and in turn imposed upon the piezoelectric element adequate vibration stresses for power generation.

A further specific object of this invention is to provide an electrical power generator for a moving vehicle or body, which generator comprises a piezoelectric element that is mechanically excited by a stream of air forced into the vehicle or body in consequence of its motion relative to the air, and which generator is capable of producing substantial power output at relatively low speeds of the body or vehicle as well as at high speeds thereof and through a wide range of altitudes and ambient air temperatures.

With these observations and objectives in mind, the manner in which the invention achieves its purpose will be appreciated from the following description and accompanying drawings, which exemplify the invention, it being understood that changes may be made in the specific apparatus disclosed herein without departing from the essentials of the invention set forth in the appended claims.

The accompanying drawings illustrate two complete examples of the embodiments of the invention constructed according to the best modes so far devised for the practical application of the principles thereof, and in which:

FIG. 4 is a view partly in side elevation and partly in longitudinal section, illustrating a nose cone incorporating a modified embodiment of the invention; and FIG. 5 is a view partly in side elevation and partly in longitudinal section taken at right angles to FIG. 4.

Figure 1:
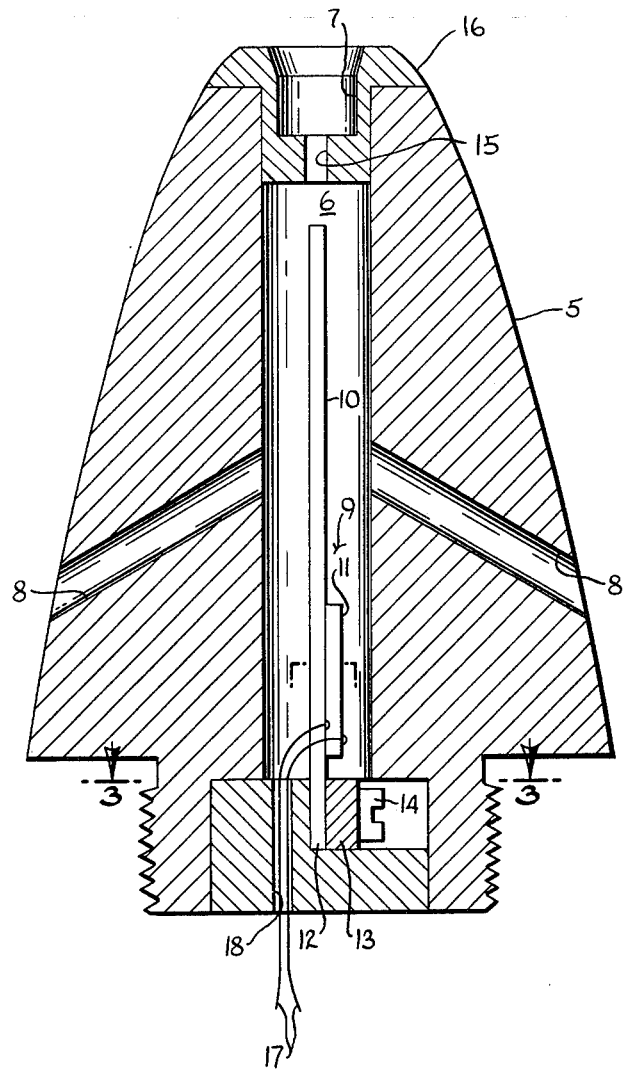
FIG. 1 is a view in longitudinal section of a nose cone for a projectile that incorporates an electrical generator embodying that principles of this invention.

Referring now to the accompanying drawings, the numeral 5 designates generally a body that has motion relative to an ambient fluid medium, the body 5 being here illustrated as a conical nose fitting for a projectile or missile that moves through the air. The body has a hollow interior that defines a coaxial cavity 6, a coaxial ram air inlet duct 7, 15 that opens to the cavity from the exterior of the body at or near the front end thereof, and air outlet ducts 8 that communicate the cavity with the exterior of the body at the sides thereof. The inlet and outlet ducts thus provide for forced flow of air through the cavity 6 in consequence of forward motion of the body 5 through the air.

Within the cavity there is mounted the electrical generator 9 of this invention, which comprises an elongated resilient tongue 10 and a piezoelectric element 11 that has a vibration transmitting connection with the tongue.

The tongue 10 extends axially of the body 5 and has its end portion 12 that is remote from the ram air duct 7, 15 secured to the body as by means of a clamp plate 13 and bolts 14. Along the remainder of its length the tongue is spaced from the walls of the cavity so that it is free to vibrate, reed-fashion; and the tongue preferably has a rectangular cross-section to encourage such vibration.

The free end of the tongue is adjacent to the zone at which the ram air inlet duct 7, 15 communicates with the cavity. The portion 15 of the ram air duct that is directly adjacent to the cavity, and which, in effect, constitutes an outlet nozzle, must have certain relationships to the tongue 10, described below, in order for the incoming ram air to transfer sufficient mechanical energy to the tongue, and through it to the piezoelectric element 11, for substantial electrical power generation.

Figure 2:
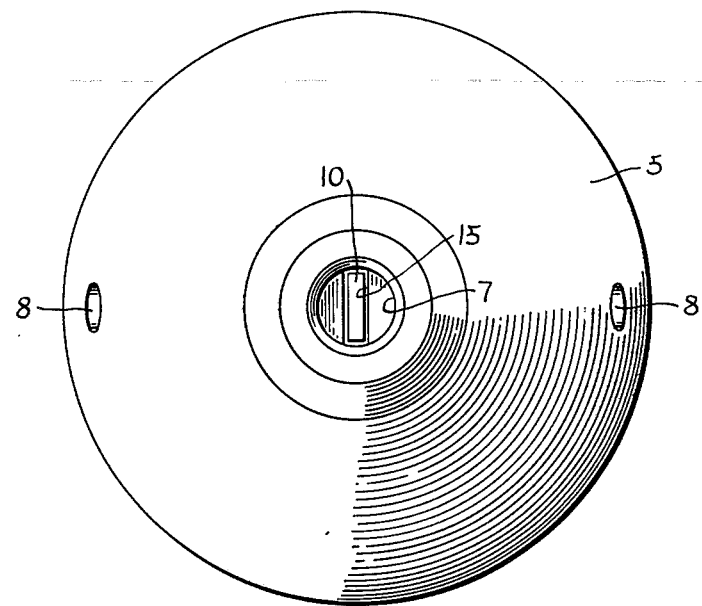
FIG. 2 is a view in end elevation of the nose cone of FIG. 2.

The nozzle portion 15 of the duct should have sufficient length to afford longitudinal guidance to the ram air flowing through it and cause that air to issue from the nozzle as a stream. As indicated above, the tongue has one smaller or minor width dimension and one larger or major width dimension, so that it tends to vibrate in the directions of its minor width dimension. The nozzle, as best seen in FIG. 2, similarly has major and minor width dimensions which are oriented in correspondence with those of the tongue. The tongue and the nozzle portion of the duct are symmetrical both ways in cross-section, so that each has a readily identifiable lengthwise extending centerline, and when the tongue is unflexed, its centerline should coincide as nearly as possible with that of the nozzle. The free end of the tongue should be relatively near the nozzle outlet. A further important relationship between the tongue and the nozzle is that the minor width of the nozzle shall be substantially equal to that of the tongue. As a minimum, the minor width of the nozzle should be only very slightly less than the minor width of the tongue; preferably the minor width of the nozzle should be equal to that of the tongue, or slightly larger but not greatly larger. The major width of the nozzle should be at least equal to that of the tongue, but can be substantially greater if desired.

The shape of the cavity in which the tongue is located is not critical, so long as it allows the tongue to have adequate space for free vibration. The air outlet ducts 8 are arranged in symmetrical relation to the ram air inlet duct and are spaced a substantial distance from the nozzle 15 in the direction toward the connected end of the tongue. The outlet ducts must have adequate size in the cross-section to permit free flow or ram air into, through and out of the cavity, which is to say that their combined cross-section area should preferably be greater than that of the ram air inlet duct.

The ram air moving through the inlet duct should have a flow that is as nearly laminar as possible, without rotation about the nozzle centerline. To promote such flow, the inlet portion 7 of the ram air duct can be formed as a well or recess which is concentric to the centerline of the nozzle portion 15 and to the body axis and which is substantially wider than the major width of the nozzle. The fowardly opening mouth of this recess can be flared somewhat, as shown in FIG. 1. The recess 7 provides a well-defined stagnation pressure zone on the nose of the body that is in line with the nozzle portion 15, assuring a source of high pressure air. The recess also serves to counteract the tendency for rotation of the air passing through the nozzle portion 15, especially if it has longitudinally extending fins or vanes 25 installed therein. (For clarity, the vanes 25 are omitted in FIG. 2.) Such rotational tendency is of course also counteracted by the cross-sectional shape of the nozzle along the substantial length thereof.

It will be apparent that with the above described relationship between the tongue 10 and the nozzle 15, the ram flow issuing from the nozzle will initially tend to flow symmetrically along both wider side surfaces of the tongue. Naturally, however, such flow will not be perfectly symmetrical, notwithstanding that the nozzle and tongue are designed to provide a fluid flow which is lengthwise of the tongue and as nearly as possible symmetrical to it. Due to the inevitable slight asymmetry of the air flow, the tongue will be slightly flexed in one direction by the pressure difference across it. By such flexure, the tongue moves towards the higher pressure air outside the airstream issuing from the nozzle, while pressure decreases across the convexly flexed tongue surface, as on the upper surface on an airfoil. There is thus created a pressure differential across the tongue that flexes it back in the opposite direction. In this way the airstream issuing from the nozzle imparts to the tongue a flexing oscillation or vibration that increases in amplitude until the steady state is attained at which the driving effect, defined by the speed and volume of ram air flow, is in equilibrium with the load acting upon the system, defined by the rigidity of the tongue and the work performed by it in transmitting mechanical energy to the piezoelectric element. Note that the frequency of tongue vibration—and hence the frequency of the electrical output of the apparatus—tends to be constant regardless of speed of the body and variations in temperature and density of ambient fluid.

Because of the flexibility of the tongue and its relatively substantial length, the free end portion of the tongue can have a comparatively large amplitude of vibration so that the mechanical impedance of the tongue as a whole tends to match the acoustical impedance of the air.

The piezoelectric element 11 is secured flatwise to the tongue near the captive end of the latter. Preferably there is a bond, as of solder or cement, between the tongue and the piezoelectric element, all along the length of the element, to require it to partake of flexing vibration of the tongue. Mounted in this manner, the relatively fragile piezoelectric element is so supported by the tongue that it can withstand the high acceleration forces to which the body may be subjected and at the same time every portion of the element is subjected to the flexing of the tongue, to fully utilize the element for power generation. It will be observed that the leverage of the tongue imposes upon the piezoelectric element vibratory components of large force but small amplitude, well suited to the mechanical impendance of the piezoelectric element.

Conductors 17 are suitably connected in a known manner with the opposite faces of the piezoelectric element and extend out of the body 5 through a bore 18 that opens from the cavity 6, for connection to load circuitry in another part of the missile or projectile.

The part of the body that defines the nozzle portion 15 of the ram air duct can comprise a separate fitting 16 which can be adjustably rotatable in the remainder of the body so that the major width of the nozzle can be readily oriented in correspondence with the major width of the tongue.

In many types of projectiles it is undesirable to have a ram inlet concentric to the body at the very front of it because this location is reserved for an impact detonator device or the like. The modified embodiment of the invention illustrated in FIGS. 4 and 5 provides for intake of ram air at locations spaced from the nose of the body and discloses another type of connection between the tongue 10 and the piezoelectric element 11, but otherwise conforms to the principles set forth above.

As shown in FIGS. 4 and 5, the body 5' is again hollow, to provide a cavity 6' in which the tongue 10 and the piezoelectric element 11 are mounted. Air outlet passages 8' open from the rear end of the cavity. In this case the ram air duct 7', 15' is substantially Y-shaped, having a pair of branch inlet portions 7' which have their outer ends at side surfaces of the body, spaced a distance behind its extreme front end. In the case of a body, such as an artillery projectile, that is intended to spin in one direction about its axis during its forward movement, the mouths of the branch inlet portions 7' can be formed as air scoops by which ram air is forced towards the cavity 6' in consequence of such spin. Thus, as shown, each air scoop can comprise a depression or concavity 23 in the body surface that leads to the leading side of the mouth (relative to the direction of spin), so that the opposite side of the mouth serves as a lip 22.

The branch inlet portions 7' communicate with a nozzle or outlet portion 15. It will be understood that the inlet portions merge with one another and with the nozzle portion 15 at some distance forwardly of the outlet of the nozzle portion and thus afford substantial length to the nozzle portion. It will be understood that the nozzle portion and the tongue 10 again have the above described dimensional and orientation relationships to one another. In cross-section, the inlet portions 7' can correspond closely to the cross-section of the nozzle portion 15 with respect to shape and width dimensions, and it will be appreciated that the inlet portions will, in any event, be so designed as to promote a non-rotating laminar flow of air through the nozzle portion.

The captive end portion of the tongue is in this case secured in a closely fitting well in a holder 19 that is fitted into the body from its rear. Again, all other portions of the tongue are spaced from the walls of the cavity so that the tongue is free for vibration along substantially its entire length in response to the motion-induced flow of air entering the cavity from the nozzle 15.

The piezoelectric element 11 is again of generally elongated shape, but in this instance it is spaced from the tongue 10 although extending generally parallel to it. One end of the piezoelectric element is anchored in the holder 19. The other end of that element is tied by means of a rigid arm or strut 20 to a medial portion of the tongue, the connection of the arm to the tongue being nearer to the captive end of the tongue than to its free end. The arm or strut 20 of course provides a motion transmitting connection by which the vibrations of the tongue are imparted to the piezoelectric element.

Figure 3:
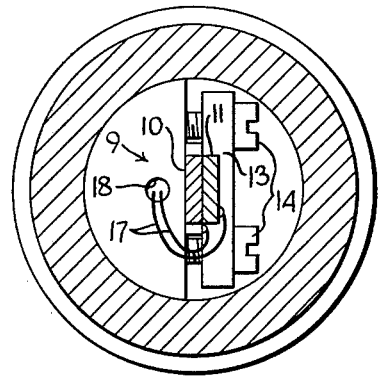
FIG. 3 is a sectional view taken on the plane of the line 3—3 in FIG. 1.

Obviously the mounting of the piezoelectric element and tongue that are illustrated in FIGS. 4 and 5 could be employed with an inlet duct arrangement like that illustrated in FIGS. 1–3, and the mounting arrangement illustrated in FIG. 1 could be employed with the ram air intake means shown in FIGS. 4 and 5.

From the foregoing description taken with the accompanying drawings it will be apparent that this invention comprises an electrical generator which is especially well suited for artillery shells, aerial bombs and the like, and which comprises a piezoelectric element and means for imparting vibration to the piezoelectric element in consequence of flow of ambient fluid through the hollow interior of a body in which the piezoelectric element is housed, said vibration imparting means serving to match the mechanical impendance of the element to the acoustical impendance of the fluid and having a high efficiency that is substantially unaffected by conditions in the fluid.

Those skilled in the art will appreciate that the invention can be embodied in forms other than as herein disclosed for purposes of illustration.

The invention is defined by the following claims

We claim:

1. An electrical generator that can serve as a power source for electrical apparatus carried in a body in which the generator is also carried, and which generator can produce electrical energy as a result of relative motion between said body and a fluid in contact therewith, said generator being of the type comprising a piezoelectric element mounted in a cavity in the body and duct means in the body by which said cavity is communicated with the exterior of the body and by which a stream of fluid is caused to flow in consequence of relative movement between the body and said fluid in contact therewith, said generator being characterized by:

A. a flexible elongated tongue in said cavity having one of its ends in substantially fixed relation to the body but being otherwise spaced from the walls of the cavity to be free for vibratory flexing, said tongue
 1. having a major width dimension and a minor width dimension so as to tend to flex in the directions of its minor width dimension and
 2. having a longitudinal centerlines which, with the tongue unflexed, is substantially straight along a substantial part of the length of the tongue from its other end;

B. said duct means defining
 1. an inlet portion which opens to the exterior of the body at a front portion thereof,
 2. an elongated nozzle portion which is communicated with said inlet portion to receive incoming fluid therefrom and is communicated with said cavity to direct such fluid thereinto in a stream, said nozzle portion
  a. having a major width at least substantially as large as the major width of the tongue and oriented in correspondence therewith,
  b. having a minor width substantially equal to the minor width of the tongue,
  c. having its longitudinal centerline coinciding with that of the unflexed tongue, and
  d. opening to the cavity near said other end of the tongue; and
 3. outlet duct means communicated with the exterior of the body rearwardly of said inlet section and communicated with said cavity at a zone spaced lengthwise along the tongue from said other end thereof; and C. means providing a motion transmitting connection between the piezoelectric element and the tongue by which vibration of the tongue is caused to impose oscillatory stresses upon the piezoelectric element, said connection being near the first mentioned end of the tongue so that the leverage of the tongue serves to match the mechanical impedance of the piezoelectric element to the acoustical impedance of the fluid.

2. The electrical generator of claim 1 wherein said means providing a motion transmitting connection comprises:
   means bonding the piezoelectric element to the tongue in surface-to-surface engagement therewith along a portion of the tongue near said one end thereof, so that the piezoelectric element partakes of vibration of the tongue.

3. The electrical generator of claim 1 wherein the piezoelectric element is elongated and extends generally parallel to the tongue, one end of the piezoelectric element being secured to the body is spaced relation to said one end of the tongue, further characterized by said motion transmitting connection comprising:
   an arm extending transversely to the tongue and the piezoelectric element between the other end of the piezoelectric element and a portion of the tongue near to but spaced from the first mentioned end of the tongue.

4. An electrical generator that can serve as a power source for electrical apparatus and which is of the type comprising a piezoelectric element and excitation means for imposing oscillatory mechanical stresses upon said element in consequence of a fluid stream, to transfer energy from said stream to said element, said electrical generator being characterized by said excitation means comprising:
   A. duct means communicated at one end with a source of fluid at one pressure and defining at its other end an outlet nozzle from which said fluid is caused to flow in a stream into a zone of lower pressure, said outlet nozzle being substantially elongated and straight in the direction of fluid flow and having
      1. a major width dimension and
      2. a minor width dimension transverse to said major width dimension;
   B. an elongated resiliently flexible tongue in said zone of lower pressure having one end near said nozzle, said tongue extending lengthwise away from said nozzle and having its other end in substantially fixed relation to the duct means, said tongue
      1. having a major width dimension no larger than the major width dimension of the outlet nozzle and oriented in correspondence with the same,
      2. having a minor width dimension extending in directions transverse to its major width dimension so as to tend to flex in said directions, said minor width dimension being substantially equal to the minor width dimension of the outlet nozzle, and
      3. said tongue, when relaxed, having its longitudinally extending centerline aligned with that of said nozzle;
   C. and means providing a force transmitting connection between said piezoelectric element and said tongue, near said other end of the latter, by which oscillatory flexing of the tongue in said directions imposes oscillatory mechanical stresses upon the piezoelectric element.

5. An electrical generator that can serve as a power source for electrical apparatus and which is of the type comprising a piezoelectric element and excitation means for imposing oscillatory mechanical stresses upon the piezoelectric element to transfer energy to it from fluid under pressure at a source thereof such as an inlet for ambient fluid in a moving body that carries said element, said excitation means comprising:
   A. an elongated, resiliently flexible tongue that has one end which is substantially fixed and has its other end free, said tongue
      1. having a major width dimension and a smaller minor width dimension extending in directions transverse to its width dimension so that its free end is capable of flexing oscillation in said directions, and
      2. when relaxed, being straight along a substantial portion of its length from its free end;
   B. nozzle means communicating with said source of fluid under pressure and having an outlet from which fluid from said source can flow in a stream, said nozzle means
      1. having its outlet near the free end of said tongue and its inlet remote from the tongue,
      2. having its outlet end portion straight and smooth so that the stream of fluid issuing therefrom towards the free end of the tongue tends to be steady, and
      3. having its outlet axis lengthwise aligned with the central plane of said minor width of the tongue when the tongue is relaxed so that such stream, in flowing along the tongue, imparts vigorous oscillation to the tongue in said directions; and
   C. means providing a force transmitting connection between said peizoelectric element and said tongue, near said one end of the tongue, by which oscillatory flexing of the tongue in said directions imposes oscillatory mechanical stresses upon the piezoelectric element.

* * * * *

UNITED STATES PATENT OFFICE
CERTIFICATE OF CORRECTION

PATENT NO. : 4,005,319
DATED : January 25, 1977
INVENTOR(S) : JAN NILSSON ET AL

It is certified that error appears in the above-identified patent and that said Letters Patent are hereby corrected as shown below:

| | |
|---|---|
| Col. 1: | Line 29, "impendance" should read --impedance-- |
| Col. 2: | Line 13, "imposed" should read --imposes-- |
| | Line 41, "that" should read --the-- |
| Col. 3: | Line 52, "the" should be deleted. |
| Col. 4: | Line 21, "on" second occurrence should read --of--. |
| | Line 37, "the" should precede "ambient" |
| Col. 5: | Line 4, "air" should precede "inlet" |
| | Line 68, "air" should precede "inlet" |
| Col. 6: | Line 13, "impend" should read --imped-- |
| | Line 14, "impendance" should read --impedance-- |
| | Line 43 (Cl. 1) "centerlines" should be singular |
| Col. 7: | Line 21 (Cl. 3) "is" should read --in-- |
| | Line 33 (Cl. 4) "of flow" should precede "of" |
| Col. 8: | Line 29, (Cl. 5) "major" should precede "width" |
| | Line 34 (Cl. 5) "communicating" should read --communicated-- |

Signed and Sealed this

Twelfth Day of April 1977

[SEAL]

Attest:

RUTH C. MASON
*Attesting Officer*

C. MARSHALL DANN
*Commissioner of Patents and Trademarks*